(12) United States Patent
Standing et al.

(10) Patent No.: US 9,867,277 B2
(45) Date of Patent: Jan. 9, 2018

(54) HIGH PERFORMANCE VERTICAL INTERCONNECTION

(71) Applicant: Infineon Technologies Austria AG, Villach (AT)

(72) Inventors: Martin Standing, Villach (AT); Andrew Roberts, Wrexham (GB)

(73) Assignee: Infineon Technologies Austria AG, Villach (AT)

( * ) Notice: Subject to any disclaimer, the term of this patent is extended or adjusted under 35 U.S.C. 154(b) by 327 days.

(21) Appl. No.: 13/654,450

(22) Filed: Oct. 18, 2012

(65) Prior Publication Data
US 2014/0111951 A1 Apr. 24, 2014

(51) Int. Cl.
*H05K 1/18* (2006.01)
*H05K 1/02* (2006.01)
(Continued)

(52) U.S. Cl.
CPC ....... *H05K 1/0207* (2013.01); *H01L 23/5389* (2013.01); *H05K 1/0265* (2013.01);
(Continued)

(58) Field of Classification Search
CPC ......... H05K 1/188; H05K 2201/09463; H05K 2201/09627; H05K 2201/0979; H05K 2201/09663; H05K 2201/10416; H05K 2201/10492; H05K 2201/10545; H05K 2201/1053; H05K 2201/10954; H05K 2201/10515
See application file for complete search history.

(56) References Cited

U.S. PATENT DOCUMENTS 5,099,309 A * 3/1992 Kryzaniwsky ........... G11C 5/00
361/679.32
6,243,272 B1 * 6/2001 Zeng ..................... H05K 1/181
174/255
(Continued)

FOREIGN PATENT DOCUMENTS

CN 1444269 A 9/2003
CN 101877348 A 11/2010
(Continued)

OTHER PUBLICATIONS

Office Action, in the Chinese language, from counterpart Chinese Application No. 201310489636.2, dated Jun. 3, 2016, 5 pp.
(Continued)

*Primary Examiner* — Timothy Thompson
*Assistant Examiner* — Roshn Varghese
(74) *Attorney, Agent, or Firm* — Shumaker & Sieffert, P.A.

(57) ABSTRACT

Representative implementations of devices and techniques provide improved electrical performance of components, such as chip dice, for example, disposed on different layers of a multi-layer printed circuit board (PCB). In an example, the components may be embedded within layers of the PCB. An insulating layer located between two component layers or sets of layers includes a conductive portion that may be strategically located to provide electrical connectivity between the components. The conductive portion may also be arranged to improve thermal conductivity between points of the PCB.

16 Claims, 5 Drawing Sheets

(51) Int. Cl.
*H01L 23/538* (2006.01)
*H05K 3/42* (2006.01)
*H05K 3/46* (2006.01)

(52) U.S. Cl.
CPC ...... *H05K 1/186* (2013.01); *H01L 2924/0002* (2013.01); *H05K 3/429* (2013.01); *H05K 3/4602* (2013.01); *H05K 2201/09545* (2013.01); *H05K 2201/09609* (2013.01); *H05K 2201/10166* (2013.01); *H05K 2201/10416* (2013.01); *H05K 2201/10492* (2013.01); *H05K 2201/10515* (2013.01); *Y10T 29/49128* (2015.01)

(56) References Cited

U.S. PATENT DOCUMENTS

| | | | |
|---|---|---|---|
| 6,713,860 B2 * | 3/2004 | Li | H01J 9/326 257/698 |
| 2003/0173676 A1 | 9/2003 | Horikawa | |
| 2004/0090758 A1 * | 5/2004 | Horikawa | H01L 23/49816 361/782 |
| 2004/0124511 A1 * | 7/2004 | Li | H05K 1/0212 257/678 |
| 2005/0146017 A1 * | 7/2005 | Koide | H01L 23/32 257/698 |
| 2005/0258533 A1 * | 11/2005 | Kumano | H01L 25/0657 257/712 |
| 2006/0250731 A1 * | 11/2006 | Parkhurst | H01L 23/62 361/56 |
| 2008/0290495 A1 * | 11/2008 | Uematsu | H01L 23/50 257/691 |
| 2010/0044094 A1 * | 2/2010 | Oka | H05K 3/44 174/264 |
| 2010/0200277 A1 * | 8/2010 | Huang | H05K 1/0204 174/252 |
| 2012/0126388 A1 | 5/2012 | Lin et al. | |
| 2012/0241207 A1 * | 9/2012 | Huang | H05K 1/025 174/262 |

FOREIGN PATENT DOCUMENTS

| | | |
|---|---|---|
| CN | 102405524 A | 4/2012 |
| CN | 102695358 A | 9/2012 |
| EP | 2228824 A1 | 9/2010 |
| WO | 2010096213 A2 | 8/2010 |

OTHER PUBLICATIONS

Office Action, in the Chinese language, from counterpart Chinese Application No. 201310489636.2, dated Jan. 5, 2017, 11 pp.

* cited by examiner

HIGH PERFORMANCE VERTICAL INTERCONNECTION

BACKGROUND

Developments in semiconductor technologies over the last few years have allowed the Figure of Merit (FoM) and circuit efficiency to be maintained, or even in some cases improved, as the size of a semiconductor device continually shrinks. Exemplary semiconductor technologies that use a shrinking form factor include embedded die and packaging technologies. In one example, an integrated circuit (IC) chip die may be located within a core layer of a printed circuit board (PCB), or between layers of a multi-layer circuit board. This technique frees up surface area on the PCB layer surfaces for other circuit components. In some cases, multiple chip dice may be located within different layers or sets of layers of a multi-layer PCB.

Interlayer connections between embedded components are sometimes managed using vias drilled through one or more of the layers of the PCB, and plated with a conductive material. The vias may be global vias, extending through all layers of the PCB, or they may be blind vias, extending through one or more layers, but not fully through all layers of the PCB. Conductive tracks formed on one or more PCB layers may be electrically coupled to one or more of the vias, providing electrical connectivity to components coupled to the conductive tracks, mounted on the same or different layers.

While electrical connectivity is provided, the use of vias as described above presents an indirect connection path. For example, the current most often travels laterally along the conductive tracks between components and vias. An indirect current path such as this may limit current capacity as well as have a restrictive impedance characteristic. Additionally, some vias may be disproportionally loaded with respect to other vias, having to carry a greater proportion of the circuit current.

Managing heat generated by the embedded components may also be problematic, as dielectric laminates used for PCB layers generally have poor thermal characteristics. Heat management of the components within the PCB layers is important for predictable circuit performance and to prolong the life of the components.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide improved electrical performance of components, such as integrated circuit (IC) chip dice, disposed on different layers of a multi-layer printed circuit board (PCB). In one implementation, power circuits (e.g., MOSFETs, IGBT, and diodes) particularly benefit from the described representative implementations. In an example, the components may be embedded within layers of the PCB. An insulating layer located between two component layers or sets of layers includes a conductive portion that may be strategically located to provide an electrical path to the components. The conductive portion may also be arranged to improve thermal conductivity between points of the PCB.

In an implementation, the conductive portion of the insulating layer provides an electrical path that is in addition to one or more conductive tracks formed on layers of the PCB in combination with drilled and plated vias. The addition of the conductive portion has the effect of increasing the current capability of electrical paths between nodes, decreasing the path resistance between the nodes, and the like. Further, the conductive portion contributes to reducing disproportional loading of vias by making parallel circuit paths available.

In one implementation, the conductive portion of the insulating layer provides increased thermal conductivity between components of the multi-layer PCB. For example, transient thermal changes may be damped based on the ability to transfer heat from one component to another. A more even heat distribution across the PCB may also be achieved based on a strategic placement of the conductive portion, leading to more efficient cooling of the PCB components.

In another implementation, the electrical circuit components may be placed or positioned such that portions of the components overlap each other. For example, portions of one electrical component may overlap portions of another. In such arrangements more efficient electrical paths as well as improved thermal conduction may result. Thus, in alternate implementations, the conductive portion may be strategically or deliberately placed with respect to one or more circuit components to optimize an electrical path and/or a cooling capacity of the components. In one example, the conductive portion is located such that it forms a thermal capacitance with respect to one or more circuit components.

Various implementations and arrangements are discussed with reference to electrical and electronics components and varied carriers. While specific components (i.e., integrated circuit chip dice, resistors, capacitors, inductors, chokes, etc.) are mentioned, this is not intended to be limiting, and is for ease of discussion and illustrative convenience. The techniques and devices discussed with reference to a chip die are applicable to any type or number of electrical components (e.g., sensors, transistors, diodes, etc.), circuits (e.g., integrated circuits, analog circuits, digital circuits, mixed circuits, ASICS, memory devices, processors, etc.), groups of components, packaged components, structures, and the like, that may be fully or partially embedded within a carrier, such as a layered printed circuit board (PCB). Additionally, the techniques and devices discussed with reference to a printed circuit board (PCB) are applicable to other types of carriers (e.g., board, chip, wafer, substrate, package, container, can, module, etc.) that the chip die may be mounted fully or partially on or within.

Various terminologies are used in this disclosure. As those skilled in the art appreciate, chip die may refer to a semiconductor device/die, semiconductor power device/die, or the like; an IC die or device may be understood to include a number of electrical components (e.g., transistors) that provide a particular level of functionality, such as and IC driver or IC controller; and a component may be understood to include a circuit element (e.g., a capacitor) that may be packaged or housed in an IC body.

Implementations are explained in more detail below using a plurality of examples. Although various implementations and examples are discussed here and below, further implementations and examples may be possible by combining the features and elements of individual implementations and examples.

Example Arrangement

Figure 1A:
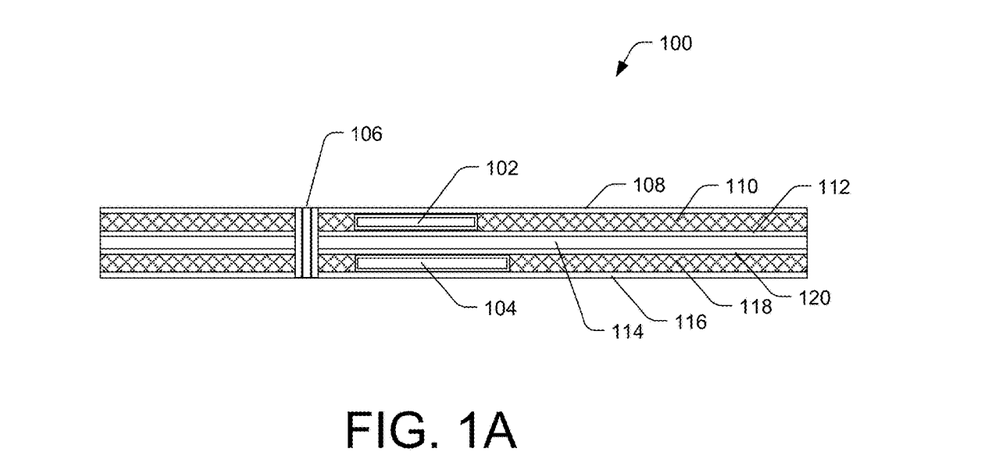
FIG. 1A is a cross-sectional profile view of a multi-layer PCB arrangement including embedded circuit components, according to an example.
Figure 1B:
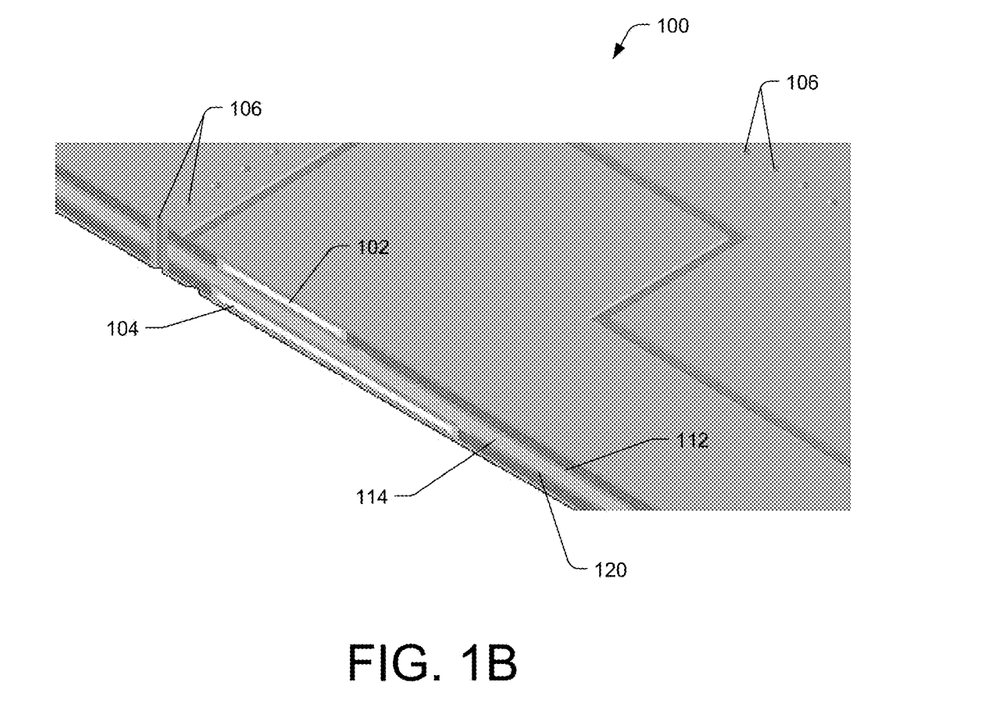
FIG. 1B is a cut-away perspective view of the example PCB arrangement of FIG. 1A. The illustration shows example locations of the embedded circuit components in relation to each other, as well as example via locations.

FIG. 1A is a cross-sectional profile view of an example multi-layer PCB arrangement 100 including example embedded circuit components 102, 104. FIG. 1B is a cut-away perspective view of the example PCB arrangement 100 of FIG. 1A. The illustrations show example locations of the embedded circuit components 102, 104 in relation to each other, as well as example via 106 locations.

Figure 2A:
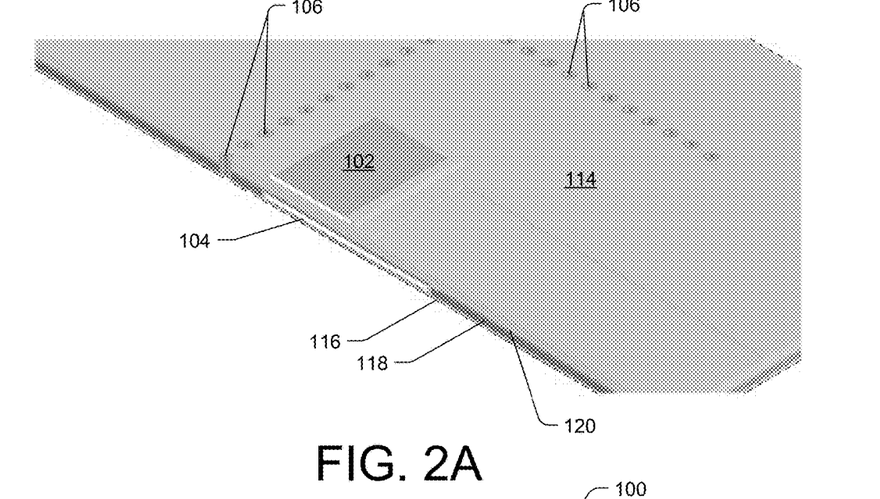
FIG. 2A is a cut-away perspective view of the PCB arrangement of FIG. 1B, showing one or more layers removed to show detail, for example.
Figure 2B:
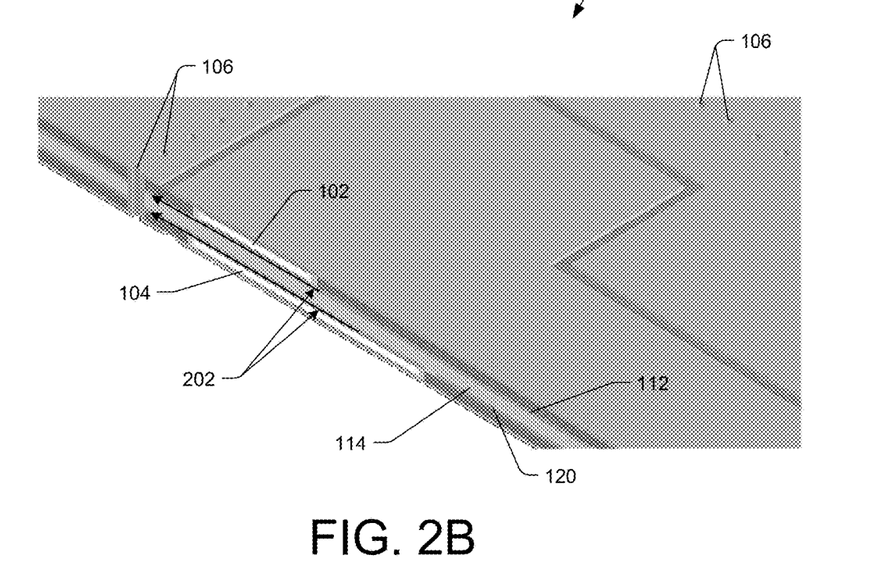
FIG. 2B is a cut-away perspective view of the PCB arrangement of FIG. 1B, showing example current paths between the circuit components.

FIG. 2A is a cut-away perspective view of the PCB arrangement 100 of FIG. 1B, showing one or more layers (108, for example) removed to show detail. FIG. 2B is a cut-away perspective view of the PCB arrangement 100 of FIG. 1B, showing example current paths 202 between the circuit components 102, 104. For example, the current paths 202 shown in FIG. 2B are associated with layers 112 and 120 and one or more vias 106.

The arrangement 100 represents an example environment whereby the techniques and devices discussed herein may be applied. For example, the chip dice 102, 104 represent any and all electrical devices that may be located (e.g., partially or fully embedded, etc.) within layers of a PCB arrangement 100. The techniques, components, and devices described herein with respect to the arrangement 100 are not limited to the illustrations in FIGS. 1A-4B, and may be applied to other designs, types, arrangements, and constructions including other electrical components without departing from the scope of the disclosure. In some cases, alternative components may be used to implement the techniques described herein. In various implementations, the arrangement 100 may be a stand-alone module, or it may be a portion of a system, component, structure, or the like.

In an implementation, the PCB arrangement 100 is comprised of multiple layers (108, 110, 112, 114, 116, 118, and 120, for example). In various implementations, the PCB arrangement 100 may have two or three layers, or it may be comprised of more layers or sets of layers (e.g., layered sub-structures, etc.), as shown in FIGS. 1A-4B. In some implementations, the arrangement 100 may have fewer or a greater number of layers than that shown in FIGS. 1A-4B.

In one implementation, the PCB arrangement 100 includes one or more "core" layer(s) 110, 118 located between two outer layers 108, 112 and 116, 120, respectively, as shown in FIGS. 1A-4B. In some implementations, the outer layers 108, 112 and 116, 120 are comprised of a conductive material or an insulating material with conductive tracks formed thereon. For example, the outer layers 108, 112 and 116, 120 may be etched copper, or the like. A pair of outer layers 108, 112 and a core layer 110 may comprise a set of layers or a layered sub-structure, for example. In another implementation, the PCB arrangement 100 includes one or more insulating layer(s) 114 situated between layers or sets of layers. In various implementations, the insulating layer(s) 114 are comprised of a dielectric material, or the like, and electrically insulates layers or sets of layers from each other.

In alternate implementations, electrical components 102, 104 (such as one or more IC chip dice, for example) are located between layers of the arrangement 100, and may be embedded within a layer, such as the core layer 110, 118, as shown in FIGS. 1A-4B. In various implementations, as discussed above, the components 102, 104 may include components such as integrated circuit (IC) chip dice, transistors, diodes, semiconductor devices, resistors, inductors, capacitors, and so forth.

In one implementation, the components 102, 104 are located fully within the layers of the PCB arrangement 100. In an alternate implementation, one or more of the components 102, 104 are located partially within the layers of the PCB arrangement 100. For example, one or more surfaces of the components 102, 104 may be exposed or extend outside of a layer of the PCB arrangement 100 while the components 102, 104 are located partially within the layer. Two embedded components 102 and 104 are shown in FIGS. 1A-4B for illustration. In various implementations, a PCB arrangement 100 may have any number of partially or fully embedded components 102, 104.

In an implementation, the PCB arrangement 100 includes one or more vias 106 drilled through one or more of the layers (108, 110, 112, 114, 116, 118, and 120, for example), and plated with a conductive material. In various implementations, the vias 106 may be global vias, extending through all layers of the PCB arrangement 100, or they may be blind vias, extending through one or more layers, but not fully through all layers of the PCB arrangement 100.

Conductive tracks formed on one or more layers (such as layers 112 and 120, for example) may be electrically coupled to one or more of the vias 106, providing electrical connectivity to components 102, 104 coupled to the conductive tracks, and mounted on the same or different layers.

For example, the layout illustrated in FIGS. 1A-4B shows a synchronous buck circuit design. The electrical components 102, 104 are represented by transistors (e.g., field-effect transistors (FET), etc.), for example. In an implementation, as shown in FIGS. 1A-4B, the placement of the components 102, 104 with respect to each other (e.g., placement in near proximity to each other, one component 102 placed over the other component 104) provides improved performance (e.g., power efficiency, speed, etc.) of the circuit.

In the example, current 202 flows from (or to) a node of one component (102, for example) to (or from) another node of another component (104, for example) laterally on the layers (layers 112, 120, for example) of the PCB arrangement 100, as shown in FIG. 2B. For example, the current 202 may flow on conductive tracks formed on the layers 112, 120. As shown in the illustration of FIG. 2B, current 202 is represented by arrows.

In the example, the current 202 flows to one or more vias 106 to traverse layers of the arrangement 100. As mentioned above, an indirect current path such as this may limit current capacity between the nodes, as well as have a restrictive impedance characteristic. Additionally, some vias 106 may be disproportionally loaded with respect to other vias 106, having to carry a greater proportion of the circuit current. The disproportionate loading may result in hot spots at various locations of the arrangement 100.

Example Implementation

Figure 3A:
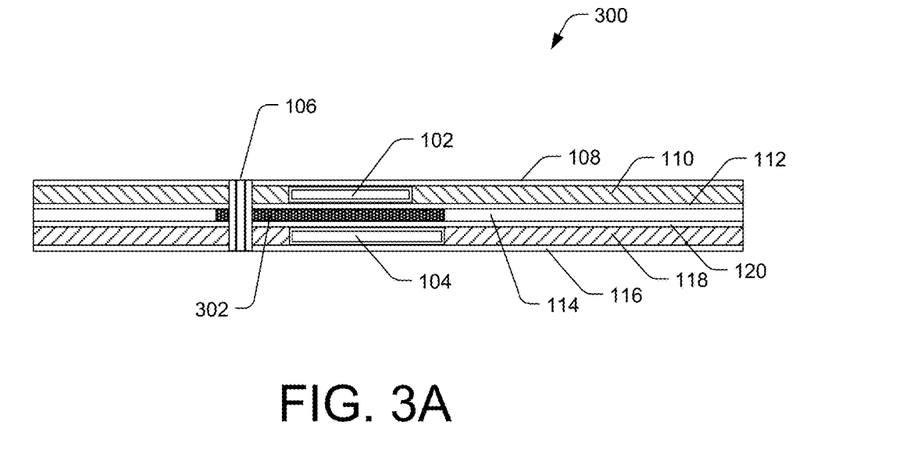
FIG. 3A is a cross-sectional profile view of an example multi-layer PCB arrangement including embedded circuit components and an insulating layer having a conductive portion, according to an implementation.

FIG. 3A is a cross-sectional profile view of an example multi-layer PCB arrangement 300, according to an implementation. The PCB arrangement 300 is substantially identical to the PCB arrangement 100, discussed above, except for the addition of one or more conductive portions 302 of the insulating layer 114.

Figure 3B:
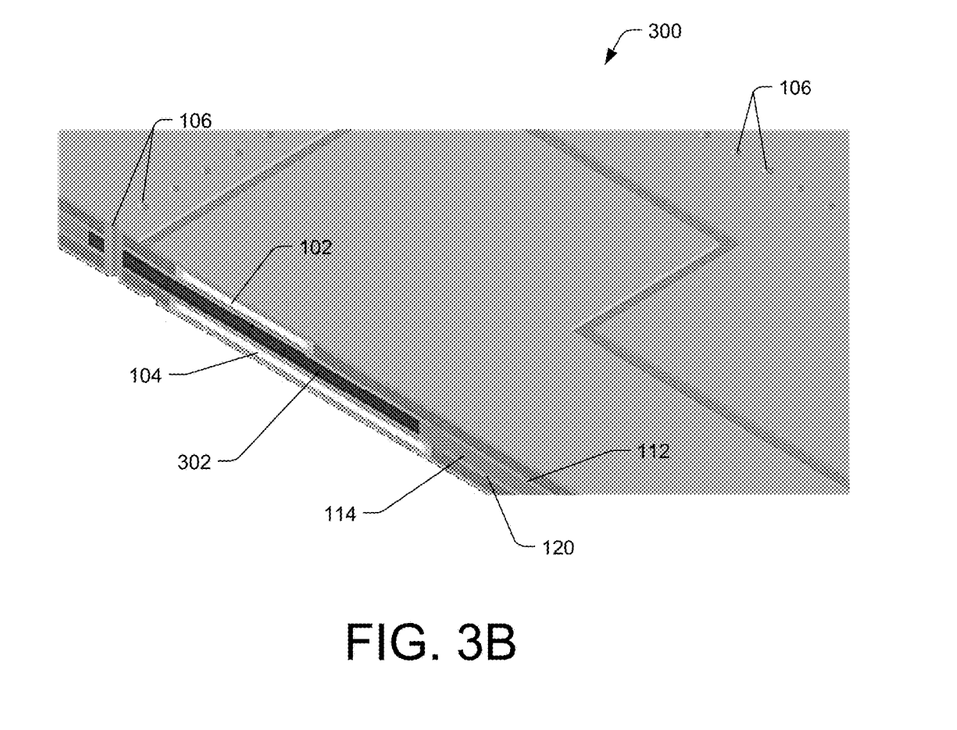
FIG. 3B is a cut-away perspective view of the example PCB arrangement of FIG. 3A. The illustration shows example locations of the embedded circuit components in relation to each other, example location of a conductive portion, as well as example via locations.
Figure 4A:
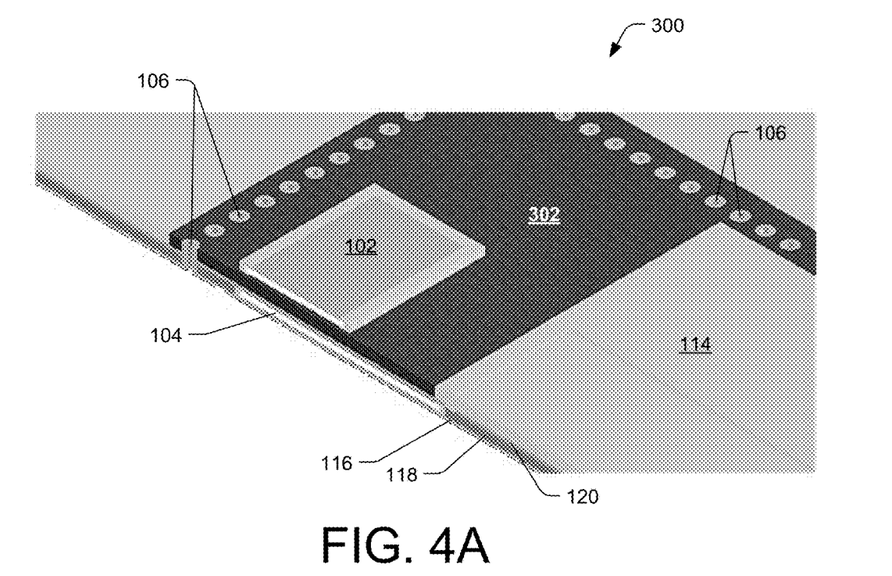
FIG. 4A is a cut-away perspective view of the PCB arrangement of FIG. 3B, showing one or more layers removed to show detail, for example.
Figure 4B:
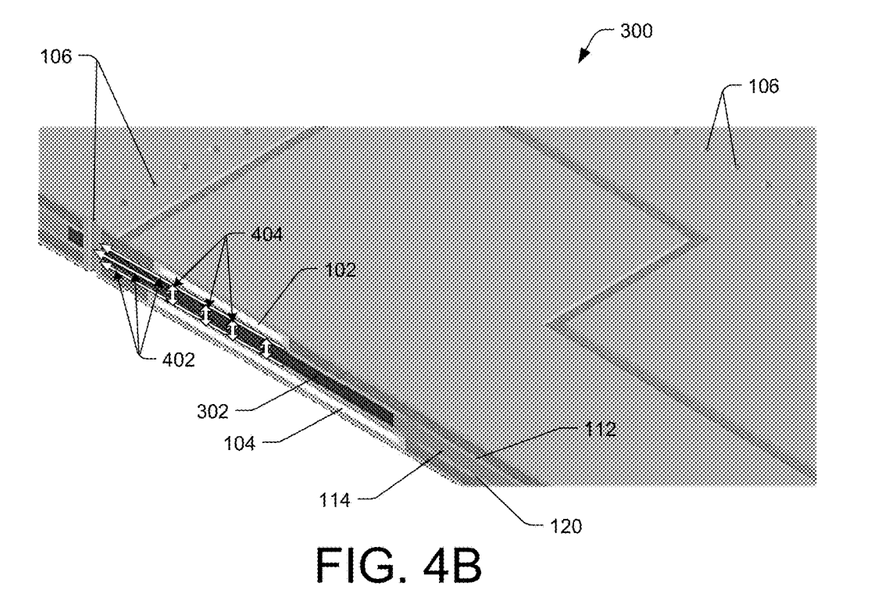
FIG. 4B is a cut-away perspective view of the PCB arrangement of FIG. 3B, showing example current paths between the circuit components with a conductive portion included, for example.

FIG. 3B is a cut-away perspective view of the example PCB arrangement 300 of FIG. 3A. The illustration shows example locations of the embedded circuit components 102, 104 in relation to each other, example location of the conductive portion 302, as well as example via 106 locations. FIG. 4A is a cut-away perspective view of the PCB arrangement 300 of FIG. 3B, showing one or more layers (108, for example) removed to show detail. An example conductive portion 302 is shown as part of the insulating layer 114. FIG. 4B is a cut-away perspective view of the PCB arrangement 300 of FIG. 3B, showing example current paths 402, 404 between the circuit components 102, 104 with a conductive portion 302 included, for example.

In an implementation, the arrangement 300 comprises at least a first layer (such as layer 112, for example), a second layer (such as layer 120, for example), and an insulating third layer (such as layer 114, for example) disposed between the first layer 112 and the second layer 120. In one implementation, a node of one circuit component (such as component 102, for example) is electrically coupled to the first layer 112 and a node of another circuit component (such as component 104, for example) is electrically coupled to the second layer 120. One or more conductive vias 106 extend through the first 112, second 120, and third 114 layers and electrically couple the first node to the second node in a first circuit path.

In various implementations, an insulating layer 114 may have one or more conductive portions 302, as shown in FIGS. 3A-4B. For example, one or more areas of the insulating layer may be replaced with a conductive material. As shown in FIG. 4B, the conductive portion(s) 302 may be arranged to electrically couple the first node to the second node in a second circuit path. In one implementation, as shown in FIG. 4A, the one or more conductive vias 106 extend through the conductive portion 302 of the third insulating layer 114.

In an alternate implementation, the arrangement 300 comprises at least a first set of layers (such as layers 108, 110, 112, for example), a second set of layers (such as layers 116, 118, 120, for example), and a dielectric layer (such as layer 114, for example) disposed between the first set of layers and the second set of layers. In the implementation, a first circuit component (such as component 102, for example) is embedded within the first set of layers and a second circuit component (such as component 104, for example) is embedded within the second set of layers.

One or more conductive vias 106 extend through the first set of layers, the second set of layers, and the dielectric layer 114 and electrically couple a first node of the first circuit component 102 to a second node of the second circuit component 104 by way of conductive tracks formed on one or more layers of the first set of layers and the second set of layers. Additionally, the dielectric layer 114 includes at least one conductive portion 302 arranged to electrically couple the first node to the second node in a second parallel circuit path.

In various implementations, the conductive portion(s) 302 may be comprised of materials such as silver epoxy, silver nano-paste, copper nano-paste, conductive carbons (e.g., nano-tubes), or other materials with conductive properties, or combinations thereof.

In an implementation, a circuit (such as the buck circuit design shown in FIGS. 3A-4B, for example) is designed and laid out on a multi-layer PCB arrangement 300, using one or more conductive portions 302, for optimized performance of the circuit elements 102, 104, including optimized electrical and thermal performance. For example, the circuit is designed and laid out such that the circuit elements 102, 104 (as well as other circuit elements) have optimized speed of operation, impedance characteristics, functional characteristics, power consumption profiles, parasitic performance, longevity, and the like, and also provide optimized management of heat generated by the circuit elements (for example the components 102,104).

For example, as shown in FIG. 4B, current 402 flows from (or to) a node of one component (102, for example) to (or from) another node of another component (104, for example) laterally on the layers (layers 112, 120, for example) of the PCB arrangement 300, in one or more first current path(s). For example, the current 402 may flow on conductive tracks formed on the layers 112, 120. As shown in the illustration of FIG. 4B, current 402 is represented by horizontal arrows.

Additionally, as shown in FIG. 4B, current 404 flows from (or to) a node of one component (102, for example) to (or from) another node of another component (104, for example) more directly through the conductive portion(s) 302 in one or more parallel second current path(s). For example, the current 404 may flow directly from the first node on the first layer 112, through the conductive portion(s) 302, and to the second node on the second layer 120. As shown in the illustration of FIG. 4B, current 404 is represented by vertical arrows.

Thus, the use of parallel circuit paths (402, 404), as shown in FIG. 4B, can cause the electrical resistance between the first node and the second node to be less than the electrical resistance of the first circuit path or the electrical resistance of the second circuit path (similar to the behavior of resistors or impedances in parallel). Additionally, in an implementation, the electrical current capability between the first node and the second node is greater than the electrical current capability of the first circuit path or the electrical current capability of the second circuit path (based on using multiple circuit paths).

In some implementations, strategically placing the conductive portion(s) 302 can ease disproportionate loading of the vias 106. For example, as shown in FIG. 4A, in one implementation, the vias 106 are drilled through the conductive portion(s) 302, and/or are electrically coupled to the conductive portion(s) 302. This can cause the vias 106 to be at substantially the same potential, and cause them to share the current loads substantially equally.

In an implementation, cooling effects of the components 102, 104 in combination with the conductive portion(s) 302 are exploited based on the strategic placement of each with respect the others. The proximity of the components 102, 104 and the conductive portion(s) 302 allows heat generated by one component 102, 104 to be thermally conducted to the other component 104, 102, either by direct contact or through thermal capacitance, and dissipated into the environment.

For example, in various implementations, one or more conductive components 302 are strategically located to assist in conducting heat generated by one of components 102, 104 to the other of the components 102, 104. For example, the conductive portion(s) 302 and the components 102, 104 are deliberately placed to improve the cooling capability of the components 102, 104 (e.g., the components 102, 104 may be arranged one over the other, and the conductive portion 302 may be arranged to be between them).

Different configurations for an arrangement 300 may be possible with different implementations. In alternate implementations, various other combinations and designs of the arrangement 300 are also within the scope of the disclosure. The variations may have fewer elements than illustrated in the examples shown in FIG. 1A through FIG. 4B, or they may have more or alternative elements than those shown.

Representative Process

Figure 5:
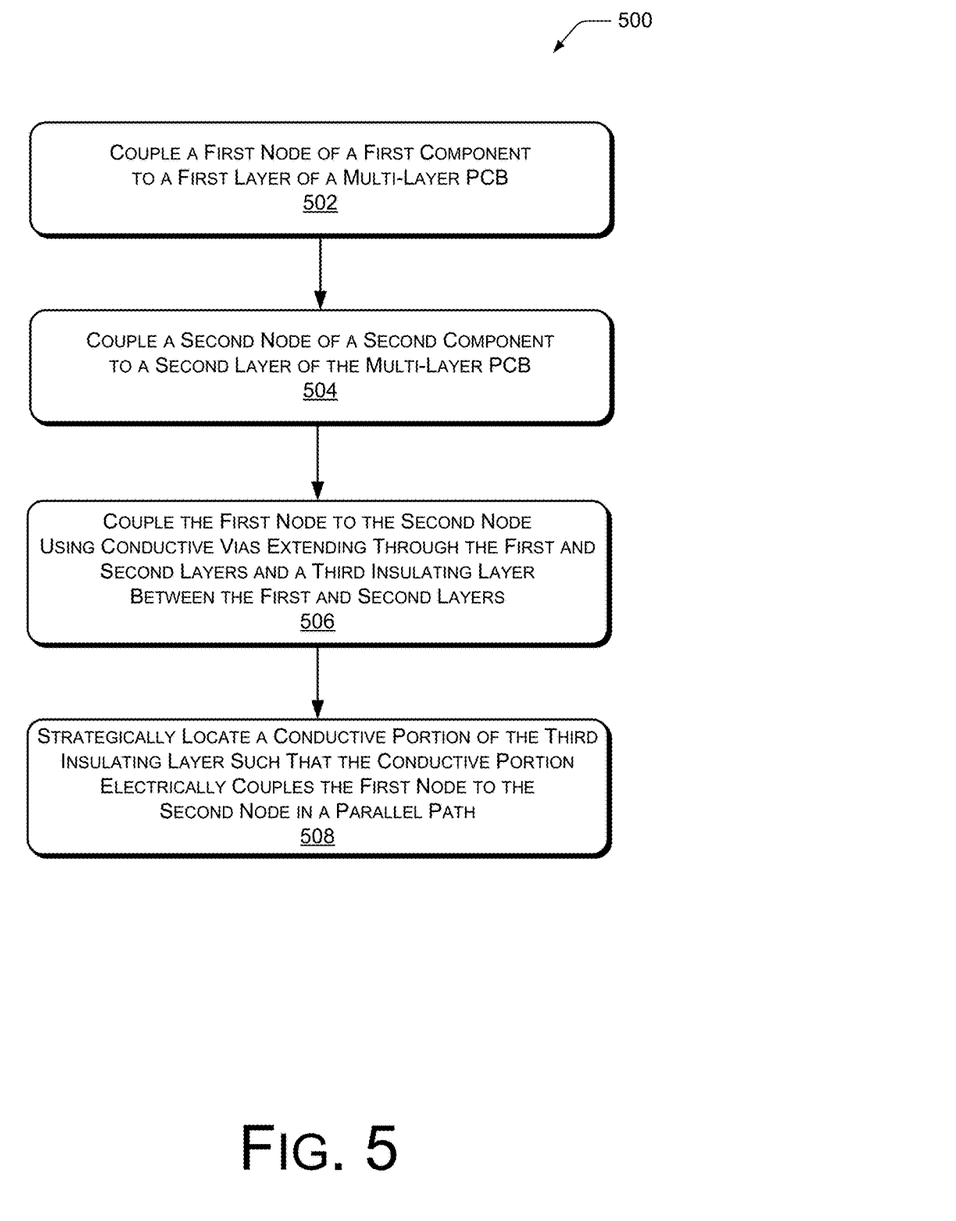
FIG. 5 is a flow diagram illustrating an example process for improving the electrical performance of components, such as chip dice, disposed on different layers of a multi-layer PCB, according to an implementation.

FIG. 5 illustrates a representative process 500 for improving electrical performance of an embedded electrical component (such as components 102, 104, for example) located within a carrier (such as PCB arrangement 300, for example), according to various implementations. In various implementations, the component(s) may be partially or fully embedded within layers of the PCB arrangement. Additionally, in some implementations, the process 500 may be used to improve thermal performance of the PCB arrangement. The process 500 is described with reference to FIGS. 1A-4B.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 502, the process includes coupling a first node of a first circuit component (such as component 102, for example) to a first layer (such as layer 112, for example) of a multi-layer printed circuit board (PCB) arrangement. In various implementations, the PCB arrangement may have any number of layers. For example, in one implementation, the process includes fully or partially embedding the first circuit component within a layered sub-structure (i.e., a first set of layers) of the PCB arrangement, the first layer comprising an element of the layered sub-structure.

At block 504, the process includes coupling a second node of a second circuit component (such as component 104, for example) to a second layer (such as layer 120, for example) of the multi-layer PCB arrangement. In another example, the process includes fully or partially embedding the second circuit component within another layered sub-structure (i.e., a second set of layers) of the PCB arrangement, the second layer comprising an element of the other layered sub-structure.

In various implementations, the process includes strategically arranging the components to optimize electrical and/or thermal performance of the PCB arrangement. For example, in an implementation, the process includes arranging the first circuit component and the second circuit component, such that the first circuit component overlaps at least a portion of the second circuit component.

At block 506, the process includes coupling the first node to the second node using one or more conductive vias (such as vias 106, for example) extending through the first layer, the second layer, and a third insulating layer (such as layer 114, for example) disposed between the first and second layers. In an implementation, the vias are electrically coupled to conductive tracks formed on the first and second layers, for example. The first and second components are electrically coupled to the conductive tracks on their respective layers.

In another implementation, the process includes coupling the first node of the first circuit component embedded within the first set of layers of the multi-layer PCB to the second node of the second circuit component embedded within the second set of layers of the PCB in a first path. In an example, the nodes are coupled using one or more conductive vias (such as vias 106, for example) extending through the first set of layers, the second set of layers, and a dielectric layer disposed between the first set of layers and the second set of layers. In other words, the insulating layer may be comprised of a dielectric material, for example. In alternate implementations, the insulating layer may be comprised of various other insulating or semi-conducting materials, or the like.

At block 508, the process includes strategically locating a conductive portion (such as conductive portion 302, for example) of the third insulating layer (or dielectric layer) such that the conductive portion electrically couples the first node to the second node in a parallel path. For example, the conductive portion forms a parallel current path between the first and second nodes to the path formed by the vias. In an implementation, the conductive portion is electrically coupled to the first and second layers, which are respectively electrically coupled to the first and second nodes.

In one implementation, the process includes increasing a current rating or decreasing a path resistance (or impedance) of an electrical connection between the first node and the second node, based on a location of the conductive portion of the third layer. For example, the conductive portion may be located to optimize electrical properties of the circuit path(s) between the first and second nodes (e.g., by proximity, size, shape, as well as materials, etc.).

In an implementation, the process includes reducing a disproportional loading of the one or more vias based on a location of the conductive portion of the third layer. For example, the vias may be located around a perimeter of the first and second components, and the conductive portion may be located so that the vias are drilled through the conductive portion. This may have the effect of placing the vias at substantially the same potential, and cause the current to be shared substantially equally between the vias.

In another implementation, the process includes strategically locating the conductive portion of the third layer such that heat generated by the first circuit component is conducted to the second circuit component. For example, the thermal conductivity may be increased between the first circuit component and the second circuit component based on strategically locating the conductive portion of the third layer. Further, the process may include damping transient changes in temperature between the first circuit component and the second circuit component based on a strategic placement of the conductive portion of the third layer.

In an example implementation, the process includes forming a thermal capacitance between the first circuit component and the second circuit component based on strategically locating the conductive portion of the third layer, in combination with strategically locating the first and second components. In various implementations, this includes deliberately positioning the conductive portion of the insulating layer (e.g., dielectric layer) to form a thermal capacitance with respect to at least one of the first and second circuit components. Further, the process may include deliberately positioning the conductive portion of the dielectric layer to distribute heat to one or more portions of the PCB.

Deliberate or strategically locating the conductive portion of the insulating layer (or dielectric layer) may include techniques used to form the conductive portion, for example. In an example implementation, the process includes forming one or more cavities within the dielectric layer, at predetermined locations, and depositing conductive material into the one or more cavities to form the conductive portion of the dielectric layer. In various implementations, the depositing may include dispensing, jetting, screen printing, stencil printing, transfer printing, or the like.

In one implementation, the forming of the insulating layer includes depositing a pre-formed sheet of dielectric material onto the first or second layers or onto a layer of the first or second sets of layers. In an example, the pre-formed sheet of dielectric material includes the one or more cavities. In an alternate implementation, the forming of the insulating layer includes depositing a pre-formed sheet of dielectric material onto a layer of the first or second layers or sets of layers and removing preselected portions of the dielectric material to form the one or more cavities.

In a further implementation, the process includes forming the insulating layer (or dielectric layer) by depositing a photo-sensitive fluid onto the first or second layers or a layer of the first or second sets of layers and photo-processing the fluid to form a dielectric layer having the one or more cavities.

In alternate implementations, other techniques may be included in the process 500 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A system, comprising:
    a multi-layer printed circuit board (PCB) including at least a first layer, a second layer, and an insulating third layer disposed between the first layer and the second layer;
    a first node of a first circuit component electrically coupled to the first layer;
    a second node of a second circuit component electrically coupled to the second layer; and
    one or more conductive vias extending along a vertical direction through the first, second, and third layers and electrically coupling the first node to the second node in a first circuit path, the insulating third layer including a conductive portion arranged to electrically couple the first node to the second node in a second circuit path, wherein the conductive portion comprises a conductive material, wherein the one or more conductive vias extend through the conductive material, and wherein the conductive material has a width along a horizontal direction that is greater than a width of the one or more conductive vias along the horizontal direction.

2. The system of claim 1, wherein the one or more conductive vias extend through the conductive portion of the third insulating layer.

3. The system of claim 1, wherein the conductive portion increases a current rating or decreases a path resistance of an electrical connection between the first node and the second node.

4. The system of claim 1, wherein the conductive portion reduces a disproportional loading of the one or more conductive vias.

5. The system of claim 1, wherein the at least one conductive via comprises a first conductive via and a second conductive via, the system further comprising a third node of the first circuit component and a fourth node of the second circuit component, wherein the third node and the fourth node are electrically coupled by way of the second via and are not electrically coupled by way of the conductive portion of the insulating third layer.

6. The system of claim 5, wherein the first node, the second node, the first conductive via, and the conductive portion of the insulating third layer comprise a first signal path, and wherein the third node, the fourth node, and the second conductive via comprise a second signal path to carry an electrical signal with a current level lower than a current level of an electrical signal carried on the first signal path.

7. The system of claim 1, wherein the first circuit component is thermally coupled to the second circuit component due to the conductive portion of the third layer.

8. The system of claim 1, wherein an electrical resistance between the first node and the second node is less than an electrical resistance of the first circuit path or an electrical resistance of the second circuit path and wherein an electrical current capability between the first node and the second node is greater than an electrical current capability of the first circuit path or an electrical current capability of the second circuit path.

9. The system of claim 1, wherein the first circuit component and the second circuit component are selected from the group including: integrated circuit (IC) chip dice, transistors, diodes, semiconductor devices, resistors, inductors, and capacitors.

10. The system of claim 1, wherein the conductive material comprises at least one of: a silver epoxy, a silver nano-paste, or a copper nano-paste.

11. The system of claim 1, wherein the one or more conductive vias are drilled through the conductive portion.

12. The system of claim 1, wherein the one or more conductive vias are electrically coupled to the conductive portion.

13. The system of claim 1, wherein the one or more conductive vias are a plurality of vias and wherein the conductive portion causes the plurality of vias to be at a same potential.

14. The system of claim 1, wherein the one or more conductive vias are a plurality of vias and wherein the conductive portion causes the plurality of vias to equally share a current load.

15. The system of claim 1, wherein one or more vias are located around a perimeter of the first circuit component and the second circuit component.

16. A system, comprising:
- a multi-layer printed circuit board (PCB) including at least a first set of layers, a second set of layers, and a dielectric layer disposed between the first set of layers and the second set of layers;
- a first circuit component embedded within the first set of layers;
- a second circuit component embedded within the second set of layers;
- one or more conductive vias extending along a vertical direction through the first set of layers, the second set of layers, and the dielectric layer and electrically coupling a first node of the first circuit component to a second node of the second circuit component by way of one or more layers of the first set of layers and the second set of layers, the dielectric layer including a conductive portion arranged to electrically couple the first node to the second node in a second parallel circuit path, wherein the conductive portion comprises a conductive material, wherein the one or more conductive vias extend through the conductive material, and wherein the conductive material has a width along a horizontal direction that is greater than a width of the one or more conductive vias along the horizontal direction.

* * * * *